(12) United States Patent
Zhu et al.

(10) Patent No.: US 12,733,324 B2
(45) Date of Patent: Sep. 8, 2026

(54) MICRO LIGHT-EMITTING DIODE (LED) STRUCTURE

(71) Applicant: Hue Inc., Shanghai (CN)

(72) Inventors: Yuankun Zhu, Shanghai (CN); Shuang Zhao, Shanghai (CN); Deshuai Liu, Shanghai (CN)

(73) Assignee: Hue Inc., Shanghai (CN)

( * ) Notice: Subject to any disclaimer, the term of this patent is extended or adjusted under 35 U.S.C. 154(b) by 345 days.

(21) Appl. No.: 18/594,029

(22) Filed: Mar. 4, 2024

(65) Prior Publication Data

US 2024/0297287 A1 Sep. 5, 2024

(30) Foreign Application Priority Data

Mar. 2, 2023 (WO) ................ PCT/CN2023/079321

(51) Int. Cl.

| | |
|---|---|
| ***H10H 20/857*** | (2025.01) |
| ***H10H 20/821*** | (2025.01) |
| ***H10H 20/855*** | (2025.01) |
| ***H10W 90/00*** | (2026.01) |

(52) U.S. Cl.

CPC ........ *H10H 20/857* (2025.01); *H10H 20/821* (2025.01); *H10H 20/855* (2025.01); *H10W 90/00* (2026.01)

(58) Field of Classification Search

CPC ... H10H 20/819; H10H 20/821; H10H 29/142

See application file for complete search history.

(56) References Cited

U.S. PATENT DOCUMENTS

| | | | |
|---|---|---|---|
| 2007/0221907 | A1 | 9/2007 | Jang et al. |
| 2023/0033031 | A1 | 2/2023 | Chen et al. |

FOREIGN PATENT DOCUMENTS

| | | | | | |
|---|---|---|---|---|---|
| CN | 1666576 | A | | 9/2005 | |
| CN | 109994584 | A | | 7/2019 | |
| CN | 111613696 | A | | 9/2020 | |
| CN | 111725251 | A | | 9/2020 | |
| CN | 113299679 | A | | 8/2021 | |
| CN | 113921556 | A | | 1/2022 | |
| CN | 114127964 | A | | 3/2022 | |
| CN | 114512504 | A | * | 5/2022 | ........... H10H 20/855 |
| CN | 114665047 | A | | 6/2022 | |
| CN | 114975724 | A | | 8/2022 | |
| TW | 202224229 | A | | 6/2022 | |

OTHER PUBLICATIONS

International Search Report and Written Opinion in PCT Application No. PCT/CN2023/079321 dated Jun. 23, 2023.

* cited by examiner

*Primary Examiner* — Christine S. Kim
*Assistant Examiner* — Emily Farmer
(74) *Attorney, Agent, or Firm* — FINNEGAN, HENDERSON, FARABOW, GARRETT & DUNNER LLP

(57) ABSTRACT

An exemplary micro light-emitting diode (LED) structure includes: a bottom epitaxial layer of a first conductive type; a light-emitting layer, formed on the bottom epitaxial layer; and a top epitaxial layer of a second conductive type. The top epitaxial layer is formed on the light-emitting layer and comprises an array of first grooves dividing the top epitaxial layer into an array of micro LEDs. Each of the first grooves comprises a first sub-groove.

38 Claims, 5 Drawing Sheets

MICRO LIGHT-EMITTING DIODE (LED) STRUCTURE

CROSS-REFERENCE TO RELATED APPLICATIONS

The present disclosure claims priority to and the benefits of PCT Application No. PCT/CN2023/079321, filed on Mar. 2, 2023, which is incorporated herein by reference in its entirety.

TECHNICAL FIELD

The present disclosure generally relates to the technical field of micro light-emitting diodes (micro LEDs), and more particularly, to a micro LED structure that mitigates or prevents electrical current crosstalk and optical crosstalk between adjacent micro LEDs.

BACKGROUND

The micro LEDs showed higher output performance than conventional LEDs due to better strain relaxation, improved light-extraction efficiency, and uniform current spreading. The micro-LEDs also exhibited improved thermal effects, higher current density, faster response rate, larger working temperature range, higher resolution, wider color gamut, higher contrast, and lower power consumption, as compared with conventional LEDs.

To achieve higher pixel density, the size of the micro LED is reduced to less than several micro meters. However, the efficiency and the carrier lifetime of the micro LED array device degrade drastically with reducing the micro LED size to a large extent, by surface recombination and poor p-type conduction induced by top-down etching. The performance of micro LED also suffers severely from quantum-confined stark effect, particularly due to the strain-induced polarization field, which leads to unstable operation and significant variations in emission wavelengths with increasing current. Additionally, with the decrease of the micro LED diameter, a large number of surface states and defects are formed at the surface of the micro LED structure by inductively coupled plasma (ICP) etching, which increases the non-radiation recombination at the surface of the micro LED structure.

Additionally, the emission of the conventional micro LED structure is mainly distributed at any direction which exhibits its poor directional emission and reduces the light intensity along the vertical direction. To realize the directional emission of the micro LED structure, extra reflective structures are configured around the mesa of the micro LED structure and at the bottom of the mesa, so as to reflect the emission light to a same direction, which causes a complex manufacturing process and increases the cost of the micro LED.

To avoid the crosstalk between the adjacent micro LEDs, an isolation structure is conventionally formed outside and around a single micro LED, thereby increasing the volume of the micro LED and decreasing the integration of the micro-display panel, and further reducing the resolution of the micro LED panel. Furthermore, the isolation structure is formed high enough to isolate the light crosstalk between the adjacent micro LEDs, thereby further increasing the volume of the micro LED. If the isolation structure is not formed at sufficient height, the crosstalk between the adjacent micro LEDs will not be efficiently inhibited.

Despite the above isolation structure, charge carriers may flow between adjacent micro LEDs, thereby causing electrical current crosstalk between neighboring pixels. Moreover, the light emitted by a pixel may enter a neighboring pixel, thereby causing optical crosstalk between neighboring pixels.

SUMMARY

In view of the technical problem associated with the electrical current crosstalk and optical crosstalk in existing micro LED structures, the present disclosure provides micro LED structures that obviate these problems. Particularly, the present disclosure provides micro LED structures with a continuous quantum well that is interconnected across an array of pixels. The disclosed micro LED structures also use a specially designed structure to mitigate or prevent electrical current crosstalk in the light-emitting layer. This structure also mitigates or prevents optical crosstalk in the micro LED structures.

According to some disclosed embodiments, an exemplary structure for a micro LED array is provided. The structure comprises: a bottom epitaxial layer of a first conductive type; a light-emitting layer, formed on the bottom epitaxial layer; and a top epitaxial layer of a second conductive type. The top epitaxial layer is formed on the light-emitting layer and comprises an array of first grooves dividing the top epitaxial layer into an array of micro LEDs. Each of the first grooves comprises a first sub-groove.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses consistent with aspects related to the invention as recited in the appended claims. Particular aspects of the present disclosure are described in greater detail below. The terms and definitions provided herein control, if in conflict with terms and/or definitions incorporated by reference.

The present disclosure provides micro LED structures for use in a display device, e.g., a micro-LED display. As described above, a micro LED structure may include a light-emitting layer. In the present disclosure, the light-emitting layer is interconnected between adjacent pixels, to form a continuous, integral light-emitting layer across the array of pixels of the micro LED structure. However, an interconnected light-emitting layer may have charge carriers flowing across different pixels, thereby causing electrical current crosstalk between neighboring pixels. Moreover, in some cases, the light emitted by a pixel may enter a neighboring pixel, thereby causing optical crosstalk between neighboring pixels. Therefore, the present disclosure provides micro LED structures that obviate these problems.

Figure 1:
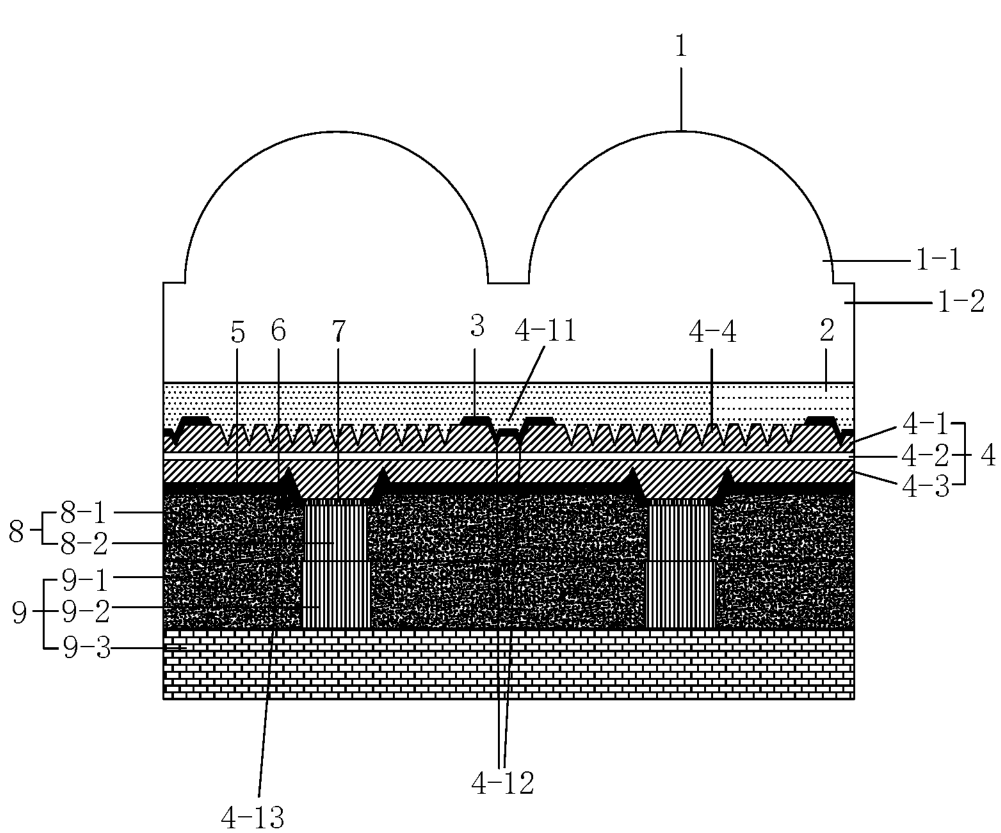
FIG. 1 is a cross-sectional view schematically showing an exemplary micro LED structure, according to some embodiments of the present disclosure.

FIG. 1 is a cross-sectional view schematically showing an exemplary micro LED structure 100 for mitigating electrical crosstalk and optical crosstalk, according to some embodiments of the present disclosure. More particularly, micro LED structure 100 comprises an array of pixels, which is formed in a micro LED display panel. FIG. 1 shows a portion of the array of pixels. As shown in FIG. 1, along a direction from a front side (i.e., a lens side) of micro LED structure 100 to a back side (i.e., a circuit side) of micro LED structure 100, it includes a micro lens layer 1, a top conductive layer 2, an epitaxial wafer 4, an insulating layer 5, a reflective layer 6, a bottom contact layer 7, a bottom conductive structure 8, and an integrated circuit (IC) backplane 9. It is noted that one pixel comprises one micro LED in the embodiment; one pixel may comprise two or more micro LEDs in another embodiment.

More specifically, as also shown in FIG. 1, in some embodiments, epitaxial layer 4 includes a top epitaxial layer 4-1, a light-emitting layer 4-2, and a bottom epitaxial layer 4-3. Top epitaxial layer 4-1 is a semiconductor epitaxial layer with a first conductive type, and bottom epitaxial layer 4-3 is a semiconductor epitaxial layer with a second conductive type. As an example, the first conductive type is N-type, and the second conductive type is P-type. As another example, the first conductive type is P-type, and the second conductive type is N-type. The structures of these layers are described below in detail.

Top epitaxial layer 4-1 forms a top surface of epitaxial layer 4. In some embodiments, top epitaxial layer 4-1 may further include (not shown in FIG. 1): an n-GaAs (i.e., N-type GaAs) layer having a thickness between 10 nm-1000 nm, inclusive; and/or a Si-doped n-AlInP (i.e., N-type AlInP) layer having a thickness between 10 nm-10 micrometers, inclusive. The above exemplary numerical values are for illustrative purposes only and are not intended to be used to limit the present disclosure.

In some embodiments, to improve the light-extraction efficiency within micro LED structure 100, top epitaxial layer 4-1 is configured to form a plurality of photonic crystals 4-4 in each pixel. Photonic crystals 4-4 are formed at the top surface of top epitaxial layer 4-1 (i.e., the top surface of epitaxial wafer 4). Consistent with the disclosed embodiments, photonic crystals 4-4 may be configured to have shapes and sizes that are suitable for improving the light-extraction efficiency. For example, as shown in FIG. 1, each of photonic crystals 4-4 may have a conical shape. As another example, each of the plurality of photonic crystals 4-4 has a height of approximately 300 nm and a diameter of approximately 266 nm, and adjacent photonic crystals 4-4 may be spaced by a distance of approximately 50 nm. Nonetheless, the disclosed embodiments are not limited to any particular shape or dimensions of the photonic crystals. For example, each of the plurality of photonic crystals 4-4 may has a cylindrical shape (not shown in FIG. 1).

Bottom epitaxial layer 4-3 forms a bottom surface of epitaxial layer 4. In some embodiments, bottom epitaxial layer 4-3 includes a Mg-doped p-AlInP layer having a thickness between 50 nm-300 nm, inclusive. These numerical values are for exemplary purposes only and are not intended to be used to limit the present disclosure. As shown in FIG. 1, in some embodiments, bottom epitaxial layer 4-3 forms an array of inverted trapezoidal shapes or an array of bowl shapes at the bottom surface of epitaxial wafer 4. Each of the inverted trapezoidal shapes or bowl shapes has a sidewall, and reflective layer 6 covers the sidewall.

Light-emitting layer 4-2 is between top epitaxial layer 4-1 and bottom epitaxial layer 4-3. In some embodiments, light-emitting layer 4-2 includes one or more layers of InGaP/AlGaInP quantum well, each layer of an InGaP/AlGaInP quantum well including an InGaP sub-layer and an AlGaInP sub-layer. For example, light-emitting layer 4-2 may include 1-20 layers of an InGaP/AlGaInP quantum well. As another example, in each layer of the InGaP/AlGaInP quantum well, the thickness of the InGaP sub-layer is approximately 3.5 nm, and the thickness of the AlGaInP sub-layer is approximately 6.5 nm. The above exemplary numerical values are for illustrative purposes only and are not intended to be used to limit the present disclosure.

Still referring to FIG. 1, top conductive layer 2 is disposed on top epitaxial layer 4-1 and forms a flat surface. In some embodiments, top conductive layer 2 is transparent and includes semiconductor-indium tin oxide (ITO). Micro lens layer 1 is disposed on top conductive layer 2, and includes an array of micro lenses 1 respectively corresponding to the array of pixels. Each of the micro lenses 1 includes a top hemisphere lens 1-1 and a lens base 1-2 below top hemisphere lens 1-1. A height of lens base 1-2 is dependent on a diameter of top hemisphere lens 1-1, e.g., the height of lens base 1-2 increases as the diameter of top hemisphere lens 1-1 increases. Bottom conductive structure 8 is disposed below bottom contact layer 4-3. Insulating layer 5 and bottom contact layer 7 are disposed between bottom conductive structure 8 and the bottom surface of epitaxial wafer 4. In some embodiments, bottom contact layer 7 includes an array of contact pads, respectively located in the array of pixels. The array of contact pads includes conductive material, such as metal. Each contact pad of bottom contact layer 7 is surrounded and insulated by insulating layer 5. Each contact pad of bottom contact layer 7 is electrically connected to bottom conductive structure 8. Reflective layer 6 is disposed between insulating layer 5 and bottom conductive structure 8. In particular, bottom epitaxial layer 4-3 forms an array of mesa structures respectively corresponding to the array of pixels, each mesa structure forming a sidewall in each of the pixels. Reflective layer 6 is formed at the bottom surface of insulating layer 5 and covers the sidewalls of the pixels.

Bottom conductive structure 8 is disposed on IC backplane 9. FIG. 1 shows an exemplary structure to achieve bonding between bottom conductive structure 8 and IC backplane 9. Specifically, bottom conductive structure 8 includes a first dielectric layer 8-1 and a first array of contact holes 8-2 formed in first dielectric layer 8-1. Each contact hole 8-2 may have a cylindrical shape. A first metal is filled in the first array of cylindrical contact holes 8-2. IC backplane 9 includes a second dielectric layer 9-1, a second array of contact holes 9-2 formed in second dielectric layer 9-1, and a chip circuit board 9-3 formed below second dielectric layer 9-1 and second array of contact holes 9-2. Each contact hole 9-2 may have a cylindrical shape. A second metal is filled in the second array of cylindrical contact holes 9-2. First array of contact holes 8-2 forms a one-to-one relationship with second array of contact holes 9-2. The first metal in the first array of cylindrical contact holes 8-2 is respectively bonded to a second metal in the second array of cylindrical contact holes 9-2.

Consistent with the disclosed embodiments, to improve the quantum wells' well plug effect (WPE) performance, light-emitting layer 4-2 is interconnected between adjacent pixels to form a continuous structure across the array of pixels. "WPE" is defined as the ratio of optical output power over consumed electrical input power as measured at a wall plug. By forming light-emitting layer 4-2 as an integral, connected structure over the array of pixels, high WPE can be achieved in micro LED structure 100, thereby ensuring high performance of the LED display device.

Bottom epitaxial layer 4-3 is interconnected between adjacent micro LED structures. Specifically, the top surface of bottom epitaxial layer 4-3 continuously extends across the array of pixels. Top epitaxial layer 4-3 is interconnected between adjacent micro LED structures. Specifically, the bottom surface of top epitaxial layer 4-1 continuously extends across the array of pixels. Moreover, light-emitting layer 4-2 is interconnected between adjacent micro LED structures. In some embodiments, in the micro LED array, the light-emitting layer 4-2 is continuously formed in the whole micro LED array; the bottom epitaxial layer 4-3 is continuously formed at the bottom surface of the light-emitting layer 4-2, and the top epitaxial layer 4-1 is continuously formed on the top surface of the light-emitting layer 4-2.

However, interconnected light-emitting layer 4-2 may cause electrical current crosstalk in the array of pixels, particularly between adjacent pixels. The micro LED structures provided by the present disclosure obviate this problem. Specifically, as shown in FIG. 1, top epitaxial layer 4-1 includes an array of first grooves 4-11 on the top surface of epitaxial wafer 4. In some embodiments, first grooves 4-11 are located one or more first sub-grooves 4-12. In some embodiments, the bottom of each sub-groove 4-12 forms a sharp angle in the cross-sectional view. Also as shown in FIG. 1, a top contact 3 is disposed in the array of first grooves 4-11 and covers both first sub-grooves 4-12 in each of first grooves 4-11. Top contact 3 can be made of metal or other conductive material that facilitates forming of ohmic contact. Since grooves 4-11 are located at positions between adjacent pixels, top contact 3 is also formed at positions between adjacent pixels. Moreover, top contact 3 is disposed between top conductive layer 2 and top epitaxial layer 4-1. The first grooves are formed in the top epitaxial layer 4-1 between the adjacent micro LEDs. In some embodiments, the first groove does not extend through the bottom of the top epitaxial layer 4-1; but in another embodiment, the first grooves can extend through the bottom of the top epitaxial layer 4-1 to the light-emitting layer 4-2. Therefore, the bottom of the first sub-groove 4-12 is not lower than the bottom of the top epitaxial layer 4-2.

In some embodiments, a top connected structure is formed in the grooves. In some embodiments, the top connected structure is continuously formed on the top epitaxial layer 4-1. Additionally, the top contact 3 is formed at the center of top surface of the top epitaxial layer 4-1, wherein the top connected structure is formed outside and around the top contact 3. Top connected structure includes a conductive material (e.g., metal) and forms an ohmic contact with top conductive layer 2. In some embodiments, top connected structure 12 and top conductive layer 2 may include the same conductive material. It is noted that the top connected structure is not necessary and can be removed when the top conductive layer 2 is formed on the top contact 3.

In the embodiment, the bottom of the first groove 4-11 is not flat. In some embodiments, the bottom of the grooves comprises one or more first sharp tips (sub-grooves 4-12). In some embodiments, one first sharp tip 4-12 is formed at the bottom of the first grooves 4-11. In some embodiments, at the center of the bottom of the first grooves 4-11. In some embodiments, the first sharp tip 4-12 is used as the first groove 4-11, that is to say, the first groove 4-11 is replaced by the first sharp tip 4-12. In some embodiments, the first sharp tip 4-12 is formed at the edge of the bottom of the first groove 4-11; furthermore, the bottom of the first sharp tip 4-12 is lower than the bottom of the first groove 4-11. The top contact 3 is further formed in the first sharp tip 4-12 and connected with the top conductive layer 2, while the top connected structure 12 is not necessary. Additionally, in some embodiments, the top contact 3 is further formed in the first sharp tip and the top connected structure is further formed in the first sharp tip 4-12 while the top conductive layer 2 is not necessary.

Figure 5:
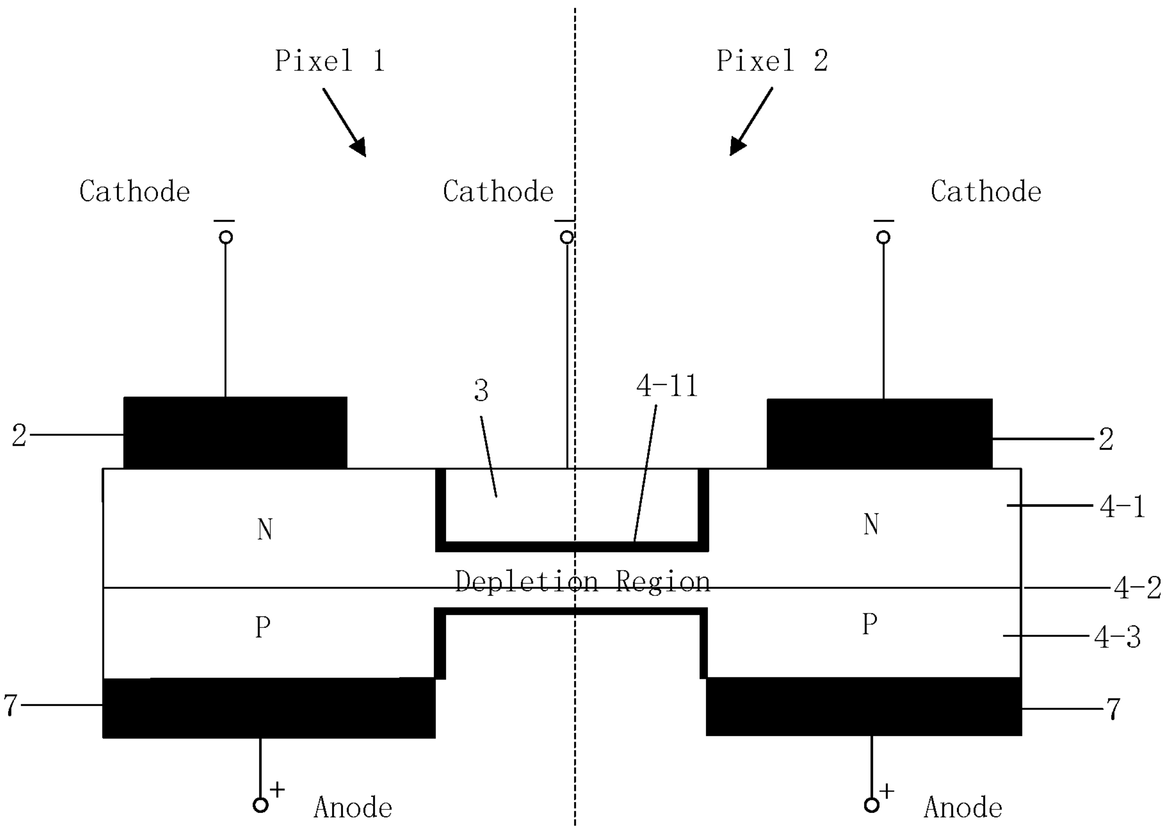
FIG. 5 is a schematic diagram illustrating a mechanism for mitigating electrical current crosstalk in a light-emitting layer of a micro LED structure, according to some embodiments of the present disclosure.

The structure of first grooves 4-11, top contact 3, and/or first sub-grooves 4-12 mitigates the electrical current crosstalk in light-emitting layer 4-2. FIG. 5 is a schematic diagram illustrating a mechanism mitigating electrical current crosstalk in light-emitting layer 4-2, according to some embodiments of the present disclosure. Specifically, FIG. 5 shows two adjacent pixels in, for example, micro LED structure 100 (FIG. 1), with light-emitting layer 4-2 being interconnected across the array of pixels. As shown in FIG. 5, first groove 4-11 is located at positions between the two adjacent pixels (Pixel 1 and Pixel 2). In each pixel, top conductive layer 2 forms a cathode on the side of top epitaxial layer 4-1, and contact layer 7 (e.g., the contact pad of bottom contact layer 7) forms an anode on the side of bottom epitaxial layer 4-3. Consistent with the structure of micro LED structure 100 in FIG. 1, FIG. 5 shows top contact 3 is disposed in first groove 4-11. FIG. 5 does not show sub-grooves 4-12, but it is contemplated that sub-grooves 4-12 are present in first groove 4-11.

Still referring to FIG. 5, top contact 3, disposed in first grooves 4-11, has a high work function and is located close to light-emitting layer 4-2. Accordingly, top contact 3 and light-emitting layer 4-2 form a Schottky contact (i.e., contact between metal and semiconductor material). The Schottky contact causes electrons to flow from light-emitting layer 4-2 to top contact 3, so as to generate an electric field in light-emitting layer 4-2 that depletes the charge carriers and creates a depletion region in light-emitting layer 4-2. The depletion region in light-emitting layer 4-2 is a high-resistance region between adjacent pixels, thereby preventing charge carriers from flowing across different pixels. Therefore, the depletion region prevents electrical current crosstalk between different pixels. In some embodiments, first grooves 4-11 are configured to form a grid that divides micro LED structure 100 into the respective pixels. With this arrangement, each pixel is completely surrounded by first grooves 4-11 and the resulting high-resistance regions can electrically isolate each pixel from its neighboring pixels.

Consistent with the disclosed embodiments, the above-described structure also prevents optical crosstalk between adjacent pixels. Specifically, referring back to FIG. 1, the light generated by each pixel is reflected by top contact 3. The two first sub-grooves 4-12 in each first groove 4-11 cause double-slit diffraction that effectively blocks the generated light's lateral propagation, thereby preventing the photons generated by a pixel from traveling into neighboring pixels. In this configuration, the bottom of each first sub-groove 4-12 serves as a slit for the diffraction. In some embodiments, the bottom of each first sub-groove 4-12 forms a sharp angle, to create a narrow slit that can produce large diffraction. In some embodiments, the bottom of each first sub-grooves 4-12 is configured to form a slit with a dimension comparable to a visible wavelength, e.g., 0.5μ. In some embodiments, first grooves 4-11 are configured to form a grid that divides micro LED structure 100 into the respective pixels. With this arrangement, each pixel is completely surrounded by first grooves 4-11, as well as first sub-grooves 4-12 (i.e., double slits). Accordingly, the resulting double-slit diffraction can optically isolate each pixel from its neighboring pixels.

Moreover, in some embodiments, a similar array of second grooves (as shown in FIG. 1) may be formed on bottom epitaxial layer 4-3 to generate similar double-slit diffraction. In some embodiments, the second groove 4-13 does not extend through the top of the bottom epitaxial layer 4-3; but in another embodiment, the second grooves 4-13 can extend through the top of the bottom epitaxial layer 4-3 to the light-emitting layer 4-2. Therefore, the top of the top second groove 4-13 is not higher than the top of the bottom epitaxial layer 4-3.

Herein, the top of the second groove 4-13 is not flat; for example, the top of the second groove 4-13 comprises one or more second sub-grooves. In some embodiments, one or more second sharp tips. In the present embodiment, the second sharp tip is used as the second groove, that is to say, the second groove 4-13 is replaced by the second sharp tip. In some embodiments, one second sharp tip is formed at the top of the second groove and the top of the second sharp tip is higher than the top of the second groove. In some embodiments, at the center of the top of the second groove. In some embodiments, the second sharp tip is formed at the edge of the top of the second groove. Furthermore, the top of the second sharp tip is higher than the top of the second groove. The insulating layer 5 is further formed in the second sharp tip. It is noted that, in another embodiment, the top of the second groove 4-13 is flat.

Furthermore, the reflective layer 6 is further formed on the insulating layer 5 in the second sharp tip. Specifically, in the present embodiment, the second groove 4-13 is formed near the center axis of the micro LED and the second groove 4-13 is far away from the first grooves 4-11, and the second groove 4-13 is not at the position corresponding to the first groove 4-11. In some embodiments, the second groove 4-13 is at the edge of the position corresponding to the bottom contact 7.

In some embodiments, bottom epitaxial layer 4-3 may include inverse second grooves 4-13 and inverse second sub-grooves (not shown in FIG. 1) at the bottom surface of epitaxial layer 4 and at positions corresponding to first grooves 4-11 and first sub-grooves 4-12 on top epitaxial layer 4-1. Accordingly, inverse second grooves 4-13 and inverse second sub-grooves are located at positions between adjacent pixels. Further, reflective layer 6 is disposed in inverse second grooves 4-13 and inverse second sub-grooves. As a result, inverse second sub-grooves 4-13 can cause double-slit diffraction to the light reflected by reflective layer 6, thereby preventing lateral propagation of the light reflected by reflective layer 6.

Consistent with the disclosed embodiments, in contrast to the need to mitigate electrical current crosstalk in light-emitting layer 4-2, electrical current expansion between adjacent pixels is desirable in top epitaxial layer 4-1. As shown in FIG. 1, in some embodiments, to enhance electrical current expansion performance between adjacent pixels, top epitaxial layer 4-1 is interconnected across the array of pixels, i.e., top epitaxial layer 4-1 forms an integral, continuous structure over the array of pixels. For example, top epitaxial layer 4-1 forms a continuous bottom surface across the array of pixels. In some embodiments, bottom epitaxial layer 4-3 is interconnected across the array of pixels. For example, bottom epitaxial layer 4-3 forms a continuous top surface across the array of pixels.

In summary, as described above, the disclosed micro LED structures (e.g., micro LED structure 100 in FIG. 1) are specifically designed with grooves and sub-grooves to mitigate electrical crosstalk and optical crosstalk.

Consistent with the disclosed embodiments, variations of micro LED structure 100 (FIG. 1) can also be developed to solve the electrical crosstalk and optical crosstalk.

Figure 2:
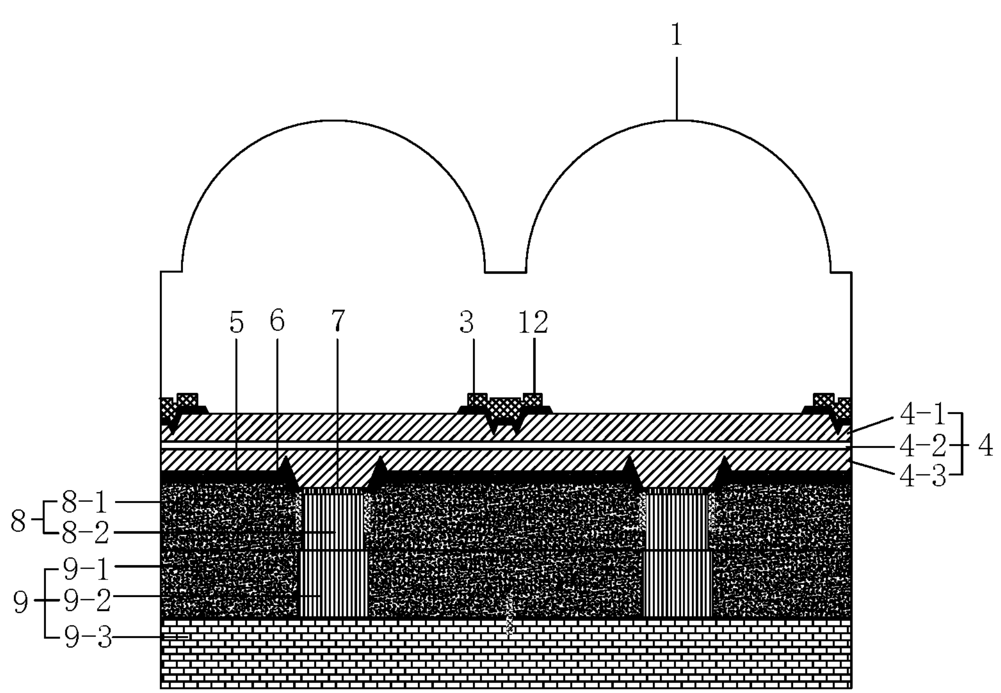
FIG. 2 is a cross-sectional view schematically showing another exemplary micro LED structure, according to some embodiments of the present disclosure.

FIG. 2 is a cross-sectional view schematically showing a micro LED structure 200, according to some embodiments of the present disclosure. As shown in FIG. 2, micro LED structure 200 is generally similar to micro LED structure 100 (FIG. 1), with the exception of two differences. Specifically, regarding the first difference, top epitaxial layer 4-1 in micro LED structure 200 is not etched to form photonic crystals 4-4. Regarding the second difference, micro LED structure 200 does not have top conductive layer 2. Instead, in micro LED structure 200, top connected structure 12 is deposited on top contact 3. Like first grooves 4-11 and top contact 3 therein, top connected structure 12 is also located at positions between adjacent micro LEDs. The top contact 3 is interconnected between adjacent micro LEDs, to form an integral, continuous structure across the array of pixels, thereby facilitating electrical current expansion in top epitaxial layer 4-1. The top contact 3 is formed between top epitaxial layer 4-1 and top conductive layer 2. In the present embodiment, the top contact 3 is formed between the adjacent micro LEDs and on the top surface of the top epitaxial layer 4-1; that is to say, the top contact 3 is formed at the edge of the micro LED or at the interface of the adjacent micro LEDs. In the present embodiment, the top contact 3 is formed on the surface of the top epitaxial layer 4-1 and at the bottom of the top connected structure 12; in some embodiments, the top contact 3 and the top connected structure 12 are formed in the first groove 4-11 and the first sub-groove 4-12. The top conductive layer 2 is not needed when the top contact 3 is formed at the bottom of the top connected structure 12; and the top conductive layer 2 is continuously formed in the micro LED array. Furthermore, the first groove 4-11 is continuously formed between the adjacent micro LEDs and in the micro LED array and the top contact 3 is continuously formed in the first groove in the micro LED array; furthermore, the top connected structure 12 is continuously formed in the first groove in the micro LED array. It is noted that, in another embodiment, the top contact 3 is formed on the top surface of the top epitaxial layer 4-1; in some embodiments, the top contact 3 is formed at the center of top surface of the top epitaxial layer 4-1. It is noted that, when the top contact 3 is formed at or near the center of the top surface of the second epitaxial layer, the top contact 3 can be as small as possible, such as a dot, which will not shield the emitting light.

Figure 3:
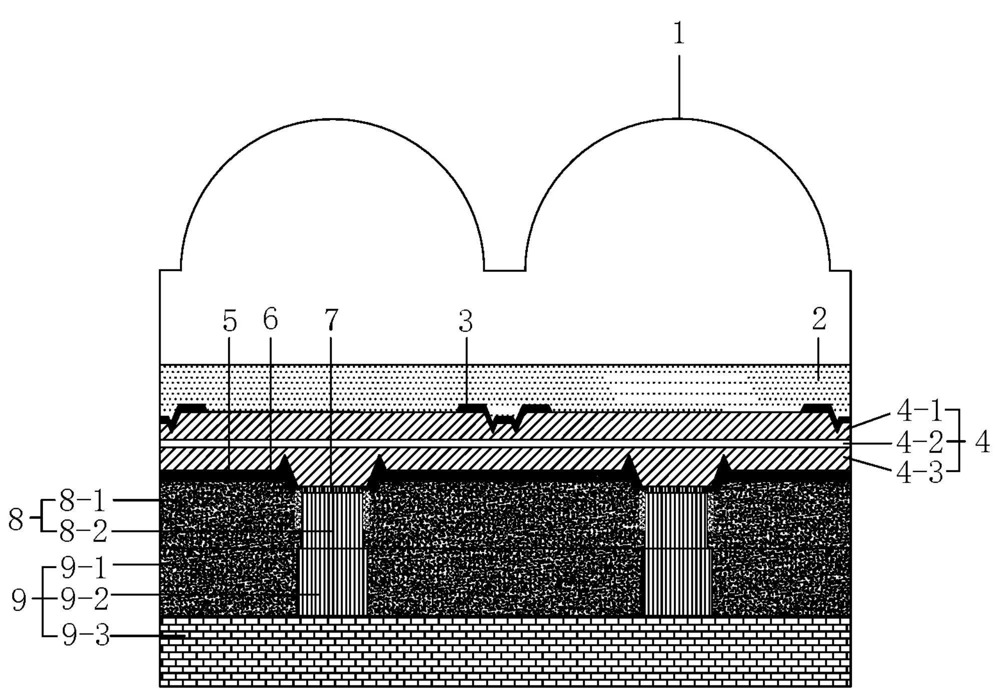
FIG. 3 is a cross-sectional view schematically showing another exemplary micro LED structure, according to some embodiments of the present disclosure.

FIG. 3 is a cross-sectional view schematically showing a micro LED structure 300, according to some embodiments of the present disclosure. As shown in FIG. 3, micro LED structure 300 is generally similar to micro LED structure 100 (FIG. 1), with the exception that micro LED structure 300 does not have photonic crystals 4-11 formed on the top epitaxial layer 4-1.

Figure 4:
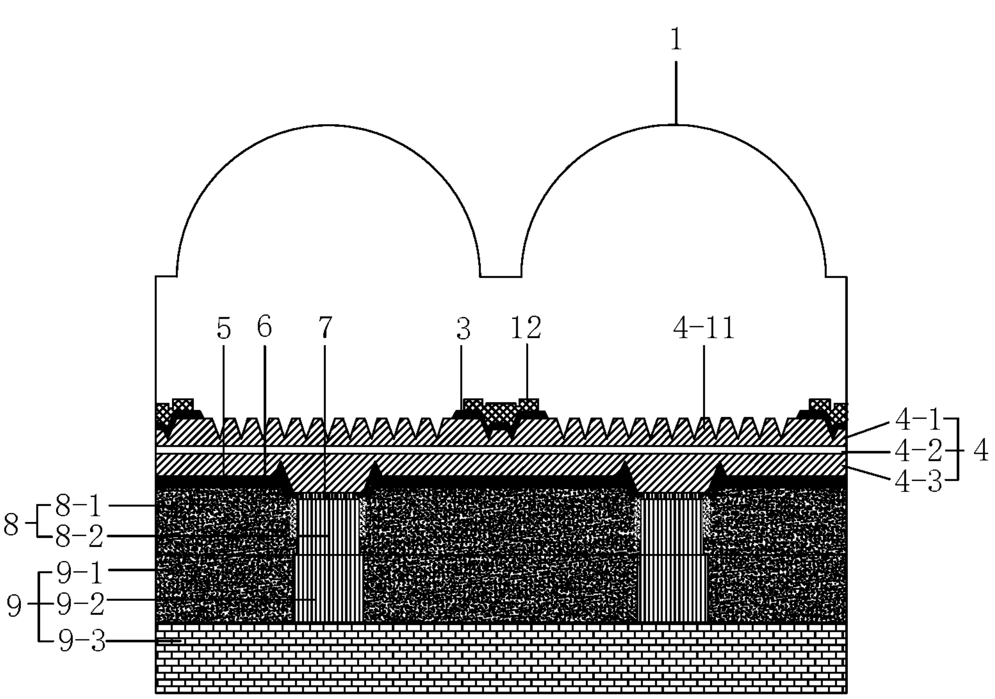
FIG. 4 is a cross-sectional view schematically showing another exemplary micro LED structure, according to some embodiments of the present disclosure.

FIG. 4 is a cross-sectional view schematically showing a micro LED structure 400, according to some embodiments of the present disclosure. As shown in FIG. 4, micro LED structure 400 is generally similar to micro LED structure 100 (FIG. 1), with the exception that micro LED structure 400 does not have top conductive layer 2. Instead, in micro LED structure 400, the top connected structure 12 is deposited on top contact 3. Like the first grooves 4-11 and the top contact 3 therein, the top connected structure 12 is also located at positions between adjacent micro LEDs, which can be referred to the micro LED structure 200 (FIG. 2). The top connected structure 12 is interconnected between adjacent pixels, to form an integral, continuous structure across the array of pixels, thereby facilitating electrical current expansion in top epitaxial layer 4-1.

In summary, the disclosed micro LED structures mitigate or prevent electrical current crosstalk and optical crosstalk. In particular, by forming an array of grooves 4-11 on epitaxial wafer 4 and disposing top contact 3 in array of grooves 4-11, charge-carrier depletion regions can be formed in light-emitting layer 4-2 and between adjacent pixels. This way, electrical current crosstalk in interconnected light-emitting layer 4-2 can be prevented. Moreover, by forming at least two sub-grooves 4-12 in each groove 4-11, double-slit diffraction can be created to reduce optical crosstalk between neighboring pixels.

According to some disclosed embodiments, an exemplary micro LED structure includes: a micro lens layer; a metal layer; an insulating layer; a reflective layer; an array of contact pads respectively corresponding to an array of pixels; a bottom conductive structure; and an integrated circuit (IC) backplane. The epitaxial wafer includes: a top epitaxial layer forming a top surface of the epitaxial wafer; a bottom epitaxial layer forming a bottom surface of the epitaxial wafer; and a light-emitting layer between the top epitaxial layer and the bottom epitaxial layer. The top epitaxial layer forms an array of grooves on the top surface, each of the grooves comprising a first sub-groove and a second sub-groove. The metal layer is disposed in the array of grooves and covers both the first and second sub-grooves in each of the grooves. The micro lens layer is disposed above the top epitaxial layer. The bottom conductive structure is disposed below the bottom epitaxial layer and on the IC backplane. The insulating layer and the array of contact pads are disposed between the bottom epitaxial layer and the bottom conductive structure. The reflective layer is disposed between the insulating layer and the bottom conductive structure.

By disposing the metal layer in grooves that are between adjacent pixels and close to the light-emitting layer, the disclosed micro LED structures allow the high-work-function metal layer to form a Schottky contact with the interconnected light-emitting layer, thereby generating an electric field in the light-emitting layer to deplete the charge carriers. Accordingly, regions with high electric resistance are created in the light-emitting layer and between adjacent pixels. These high-resistance regions prevent charge carriers flowing across adjacent pixels and thus mitigate electrical current crosstalk in the interconnected light-emitting layer.

Moreover, the metal layer serves as a reflective layer that prevents the photons generated by a pixel from entering neighboring pixels. In addition, by forming two sub-grooves on the top epitaxial layer and/or the bottom epitaxial layer, the disclosed micro LED structures create two slits at positions between adjacent pixels, resulting in double-slit diffraction that can effectively prevent lateral propagation of the light generated by each pixel. Therefore, the disclosed micro LED structures can prevent optical crosstalk.

According to some disclosed embodiments, the light-emitting layer is interconnected between adjacent pixels. Such interconnected quantum well structure enhances the well plug effect (WPE) performance of micro-LED chips.

According to some disclosed embodiments, the top epitaxial layer is interconnected between adjacent pixels, so as to form an interconnected structure across the array of pixels. Such interconnected top epitaxial layer facilitates electric current expansion.

According to some disclosed embodiments, the bottom epitaxial layer forms an array of inverted trapezoidal shapes or an array of bowl shapes at an interface between the bottom epitaxial layer and the bottom conductive structure. As a result, the bottom of the inverted trapezoidal structure or bowl structures can reflect the light emitted from the quantum well to its periphery, so as to further gather the light and improve light utilization.

According to some disclosed embodiments, the bottom conductive structure includes a first dielectric layer and a first metal. A first array of cylindrical contact holes is formed in the first dielectric layer and the first metal is filled in the first array of cylindrical contact holes. Moreover, the IC backplane includes a second dielectric layer, second metal, and a chip circuit board. The second dielectric layer includes a second array of cylindrical contact holes and the second metal is filled in the second array of cylindrical contact holes. The first metal in the first array of cylindrical contact holes is respectively bonded to the second metal in the second array of cylindrical contact holes. As a result, the bottom conductive structure is bonded to the IC backplane.

According to some disclosed embodiments, a top conductive layer with a flat surface is formed on the metal layer and the top epitaxial layer. The top conductive layer may be an indium tin oxide (ITO) layer including N-type oxide semiconductor-indium tin oxide (ITO). The top conductive layer improves electric current expansion between adjacent pixels.

According to some disclosed embodiments, the top epitaxial layer forms a plurality of photonic crystals in each pixel. The photonic crystals are used to improve the micro LED structures' light-extraction efficiency. The photonic crystals can have various shapes and be arranged according to various pitches. For example, the shape of the photonic crystals can be designed according to experimental data regarding the light-extraction efficiency. For example, the photonic crystals may be designed to be cylindrical or conical. Such shapes generally can achieve satisfactory light-extraction efficiency. For another example, the pitch of the photonic crystals is determined by the etching depth and spacing distance between adjacent photonic crystals. For another example, the photonic crystals may have a height of 300 nm, and/or a diameter of 266 nm. And adjacent photonic crystals may be separated by a pitch distance of 50 nm. These exemplary numerical values are for illustrative purposes only and are not intended to be used to limit the present disclosure.

In summary of the present disclosure, by disposing the metal layer in grooves that are between adjacent pixels and close to the light-emitting layer, the disclosed micro LED structures allow the high-work-function metal layer to form a Schottky contact with the interconnected light-emitting layer, thereby generating an electric field in the light-emitting layer to deplete the charge carriers. Accordingly, regions with high electric resistance are created in the light-emitting layer and between adjacent pixels. These high-resistance regions prevent charge carriers flowing across adjacent pixels and thus mitigate electrical current crosstalk in the interconnected light-emitting layer.

Moreover, the metal layer serves as a reflective layer that prevents the photons generated by a pixel from entering neighboring pixels. By forming two sub-grooves on the top epitaxial layer and/or the bottom epitaxial layer, the disclosed micro LED structures create two slits at positions between adjacent pixels, resulting in double-slit diffraction that can effectively prevent lateral propagation of the light generated by each pixel. Therefore, the disclosed micro LED structures can also prevent optical crosstalk.

As used herein, unless specifically stated otherwise, the term "or" encompasses all possible combinations, except where infeasible. For example, if it is stated that a database may include A or B, then, unless specifically stated otherwise or infeasible, the database may include A or B, or A and B. As a second example, if it is stated that a database may include A, B, or C, then, unless specifically stated otherwise or infeasible, the database may include A, or B, or C, or A and B, or A and C, or B and C, or A and B and C.

It will be appreciated that the embodiments of the present disclosure are not limited to the exact construction that has been described above and illustrated in the accompanying drawings, and that various modifications and changes may be made without departing from the scope thereof. While the present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

What is claimed is:

1. A micro light-emitting diode (LED) structure, comprising: a bottom epitaxial layer of a first conductive type; a light-emitting layer, formed on the bottom epitaxial layer; a top epitaxial layer of a second conductive type, wherein: the top epitaxial layer is formed on the light-emitting layer and comprises an array of first grooves dividing the top epitaxial layer into an array of micro LEDs; and each of the first grooves comprises a first sub-groove, wherein each first sub-groove forms a sharp tip.

2. The micro LED structure according to claim 1, wherein:

the array of first grooves is formed between adjacent micro LEDs;

a bottom of each first groove is higher than a bottom of the respective first sub-groove; and a bottom of each first sub-groove is not lower than a bottom of the top epitaxial layer.

3. The micro LED structure according to claim 1, wherein the micro LED structure further comprising:

a top contact disposed in the array of first grooves; and a bottom conductive structure formed below the bottom epitaxial layer, wherein the top contact is disposed in each first sub-groove.

4. The micro LED structure according to claim 3, wherein a top connected structure is further formed on the top contact in the array of first grooves.

5. The micro LED structure according to claim 3, further comprising a top conductive layer formed on the top contact and the top epitaxial layer.

6. The micro LED structure according to claim 1, further comprising:

an array of second grooves formed in the bottom epitaxial layer, wherein the array of the second grooves respectively corresponds to the array of micro LEDs.

7. The micro LED structure according to claim 6, wherein each of the second grooves comprises a second sub-groove.

8. The micro LED structure according to claim 7, wherein each second sub-groove forms a sharp tip.

9. The micro LED structure according to claim 6, wherein the array of second grooves has sharp tips.

10. The micro LED structure according to claim 6, wherein a top of the array of second grooves is not higher than a top of the bottom epitaxial layer.

11. The micro LED structure according to claim 6, further comprising an array of bottom contacts formed on a bottom surface of the bottom epitaxial layer, wherein:

the array of bottom contacts is respectively disposed in the array of micro LEDs, and the array of second groove is formed at positions corresponding to edges of the array of bottom contacts.

12. The micro LED structure according to claim 6, wherein the array of second grooves is at positions respectively corresponding to the array of first grooves.

13. The micro LED structure according to claim 1, further comprising a micro lens layer formed above the top epitaxial layer.

14. The micro LED structure according to claim 13, wherein the micro lens layer comprises an array of micro lenses respectively corresponding to the array of micro LEDs.

15. The micro LED structure according to claim 14, wherein each of the micro lenses comprises a top hemisphere lens and a lens base below the top hemisphere lens.

16. The micro LED structure according to claim 15, wherein a height of the lens base is dependent on a diameter of the top hemisphere lens.

17. The micro LED structure according to claim 1, further comprising an insulating layer formed at a bottom surface of the bottom epitaxial layer.

18. The micro LED structure according to claim 17, further comprising an array of bottom contacts formed in the insulating layer and at the bottom surface of the bottom epitaxial layer, the array of bottom contacts respectively corresponding to the array of micro LEDs.

19. The micro LED structure according to claim 18, further comprising a bottom conductive structure formed below the bottom epitaxial layer, wherein each of the bottom contact is surrounded by the insulating layer and electrically connected to the bottom conductive structure.

20. The micro LED structure according to claim 17, wherein the array of micro LEDs respectively forms an array of sidewalls at a bottom surface of the bottom epitaxial layer, and wherein the micro LED structure further comprises a reflective layer formed at a bottom surface of the insulating layer and covering the sidewalls of the micro LED.

21. The micro LED structure according to claim 1, wherein the bottom epitaxial layer forms an array of inverted trapezoidal shapes or an array of bowl shapes.

22. The micro LED structure according to claim 1, further comprising:

a bottom conductive structure formed below the bottom epitaxial layer; and an integrated circuit (IC) backplane formed below and electrically connected to the bottom conductive structure.

23. The micro LED structure according to claim 22, wherein:

the bottom conductive structure comprises a first dielectric layer and a first array of contact holes formed in the first dielectric layer; and the IC backplane comprises a second dielectric layer and a second array of contact holes formed in the second dielectric layer, the second array of contact holes respectively corresponding to the first array of contact holes.

24. The micro LED structure according to claim 23, wherein a first metal is filled in the first array of contact holes and a second metal is filled in the second array of contact holes, the first metal in the first array of contact holes being respectively bonded to the second metal in the second array of contact holes.

25. The micro LED structure according to claim 24 further comprising:

an array of bottom contacts formed at a bottom surface of the bottom epitaxial layer, the array of bottom contacts being electrically connected to the first metal in the array of contact holes, respectively.

26. The micro LED structure according to claim 23, wherein the IC backplane further comprises:

a chip circuit board formed below the second dielectric layer and the second array of contact holes.

27. The micro LED structure according to claim 1, wherein the micro LED structure further comprises a top conductive layer formed on the top epitaxial layer.

28. The micro LED structure according to claim 27, wherein the top conductive layer is transparent and comprises indium tin oxide (ITO).

29. The micro LED structure according to claim 1, wherein each of the micro LED comprises a plurality of photonic crystals, formed in the top epitaxial layer.

30. The micro LED structure according to claim 29, wherein a bottom of the plurality of photonic crystals is not lower than a bottom of the top epitaxial layer.

31. The micro LED structure according to claim 29, wherein each of the plurality of photonic crystals has a cylindrical shape or a conical shape.

32. The micro LED structure according to claim 31, wherein each of the plurality of photonic crystals has a height of 300 nm and a diameter of 266 nm, and adjacent photonic crystals are spaced by a distance of 50 nm.

33. The micro LED structure according to claim 1, wherein:

the first conductive type is N-type and the second conductive type is P-type; or the first conductive type is P-type and the second conductive type is N-type.

34. The micro LED structure according to claim 1, wherein the light-emitting layer is interconnected across the array of micro LEDs.

35. The micro LED structure according to claim 1, wherein the top epitaxial layer is interconnected across the array of micro LEDs.

36. The micro LED structure according to claim 35, wherein the top epitaxial layer forms a continuous bottom surface across the array of micro LEDs.

37. The micro LED structure according to claim 1, wherein the bottom epitaxial layer is interconnected across the array of micro LEDs.

38. The micro LED structure according to claim 37, wherein the bottom epitaxial layer forms a continuous top surface across the array of micro LEDs.

* * * * *